United States Patent
Nakata

(10) Patent No.: US 9,442,160 B2
(45) Date of Patent: Sep. 13, 2016

(54) PROBE ASSEMBLY AND PROBE BASE PLATE

(71) Applicant: Kabushiki Kaisha Nihon Micronics, Tokyo (JP)

(72) Inventor: Yoshiro Nakata, Tokyo (JP)

(73) Assignee: Kabushiki Kaisha Nihon Micronics, Musashino-shi, Tokyo (JP)

( * ) Notice: Subject to any disclaimer, the term of this patent is extended or adjusted under 35 U.S.C. 154(b) by 176 days.

(21) Appl. No.: 14/203,285

(22) Filed: Mar. 10, 2014

(65) Prior Publication Data
US 2014/0300383 A1    Oct. 9, 2014

(30) Foreign Application Priority Data
Apr. 4, 2013   (JP) ................................ 2013-078346

(51) Int. Cl.
*G01R 31/28* (2006.01)
*G01R 1/073* (2006.01)

(52) U.S. Cl.
CPC ....... *G01R 31/2889* (2013.01); *G01R 1/07378* (2013.01)

(58) Field of Classification Search
None
See application file for complete search history.

(56) References Cited

U.S. PATENT DOCUMENTS

| | | | |
|---|---|---|---|
| 5,949,245 A * | 9/1999 | Liu ..................... | G01R 1/07342 324/756.03 |
| 6,784,678 B2 * | 8/2004 | Pietzschmann .... | G01R 1/07378 324/750.22 |
| 7,667,472 B2 * | 2/2010 | Miura ................ | G01R 1/07314 324/750.16 |
| 2009/0058440 A1 | 3/2009 | Miura et al. | |
| 2009/0284273 A1 | 11/2009 | Hasegawa | |
| 2010/0066396 A1 | 3/2010 | Miura et al. | |
| 2010/0134121 A1 | 6/2010 | Sato et al. | |

FOREIGN PATENT DOCUMENTS

| | | |
|---|---|---|
| JP | 2011-089891 | 5/2011 |
| JP | 2012-064973 | 3/2012 |
| KR | 20080048920 A | 6/2008 |

\* cited by examiner

*Primary Examiner* — Paresh Patel
(74) *Attorney, Agent, or Firm* — Lorenz & Kopf LLC

(57) ABSTRACT

A probe assembly includes a wiring base plate arranged on a lower surface side of a reinforcing plate and a probe base plate arranged on a lower surface side of the wiring base plate. The probe base plate includes a plurality of probes on a lower surface thereof and a plurality of anchor portions on an upper surface thereof, respectively. The anchor portions are set so that a height of the anchor portion arranged at a center portion of the probe base plate may be greater than a height of the anchor portion located at a peripheral portion of the probe base plate. Between the respective anchor portions and the reinforcing plate are arranged a plurality of brace portions corresponding to the plurality of anchor portions and determining a space between the probe base plate and the wiring base plate together with the anchor portions.

11 Claims, 5 Drawing Sheets

PROBE ASSEMBLY AND PROBE BASE PLATE

RELATED APPLICATION

This application claims the benefit of, and claims priority to, Japanese patent application number 2013-078346, filed on Apr. 4, 2013.

TECHNICAL FIELD

The subject matter relates to a probe assembly and a probe base plate for use in an electric test and the like of a device under test such as a semiconductor integrated circuit.

BACKGROUND

A device under test (DUT) such as a set of semiconductor integrated circuits formed on a semiconductor wafer is generally electrically tested by a semiconductor testing system including a probe apparatus (prober) and the like. Such a semiconductor testing system can determine whether or not the DUT is good by supplying electric signals from a tester via a probe assembly to the DUT. The probe assembly includes a probe base plate (probe card) having probes arranged differently per DUT, and the probes contact respective terminals of the DUT. The respective terminals of the DUT are arranged on a plane, and the respective probes desirably contact the respective terminals with uniform loads (refer to Patent Literature 1).

In the test of the DUT, a stage holding the DUT presses the DUT to the probes of the probe assembly so that the respective terminals of the DUT may contact the respective probes reliably. A load to each terminal of the DUT is a predetermined value. For example, in a case where the number of probes is 50000, the DUT needs to be pressed up with a force 50000 times the load applied to each probe. The probe assembly includes a highly rigid reinforcing plate, but when the probe assembly receives enormous loads, the probe assembly may warp, and variations in load and distance to the terminal may occur among the probes in the equal plane. Such variations cause test accuracy to be degraded. As a countermeasure against this problem, a method for fixing a clamp head formed at a center portion on a rear surface of a probe card is disclosed to prevent a center of the probe card from being raised (refer to Patent Literature 2).

CITATION LIST

Patent Literature

PTL1: Japanese National Patent Appln. Public Disclosure No. 2011-89891
PTL2: Japanese National Patent Appln. Public Disclosure No. 2012-64973

SUMMARY

A probe assembly and a probe base plate are provided which uniform loads at the time of contact with a device under test and improve test accuracy.

A probe assembly according to a first embodiment includes a reinforcing plate, a wiring base plate arranged on a lower surface side of the reinforcing plate, a probe base plate having an upper surface and a lower surface, arranged on a lower surface side of the wiring base plate, including a plurality of probes formed on the lower surface of the probe base plate and a plurality of anchor portions formed on the upper surface of the probe base plate, respectively, and arranging the plurality of anchor portions so that a height of the anchor portion arranged at a center portion of the probe base plate may be greater than a height of the anchor portion located at a peripheral portion of the probe base plate in a planar view, an elastic connector arranged between the wiring base plate and the probe base plate and electrically connecting the wiring base plate to the plurality of probes, and a plurality of brace portions arranged between the plurality of anchor portions and the reinforcing plate to correspond to the plurality of anchor portions and determining a space between the probe base plate and the wiring base plate together with the plurality of anchor portions.

A probe assembly according to a second embodiment includes a reinforcing plate, a wiring base plate arranged on a lower surface side of the reinforcing plate, a probe base plate arranged on a lower surface side of the wiring base plate and having formed on a lower surface thereof a plurality of probes, an elastic connector arranged between the wiring base plate and the probe base plate and electrically connecting the wiring base plate to the plurality of probes, and a plurality of spacer portions arranged between the probe base plate and the reinforcing plate and determining a space between the probe base plate and the wiring base plate, wherein a height of the spacer portion arranged at a center portion of the probe base plate is greater than a height of the spacer portion located at a peripheral portion of the probe base plate in a planar view.

Also, in the probe assembly according to the first and second embodiments, the probe base plate can be curved to be protruded downward in a state of not receiving a force pressing the plurality of probes.

Also, in the probe assembly according to the second embodiment, the plurality of spacer portions can include a plurality of brace portions fixed at first ends thereof on the lower surface of the reinforcing plate and a plurality of anchor portions formed on an upper surface of the probe base plate and arranged to contact at first ends thereof second ends of the plurality of brace portions.

Also, in the probe assembly according to the first and second embodiments, the wiring base plate can include a plurality of through holes, and the plurality of brace portions can be arranged via the plurality of through holes.

Also, in the probe assembly according to the first and second embodiments, the plurality of brace portions can have equal heights to one another.

Also, in the probe assembly according to the first and second embodiments, the elastic connector can include connection portions electrically connecting the wiring base plate to the plurality of probes, and the probe base plate can be fixed to the wiring base plate by forming a decompression chamber covering the connection portions between the wiring base plate and the probe base plate.

A probe base plate according to a third embodiment respectively includes a plurality of probes on a lower surface thereof and a plurality of anchor portions on an upper surface thereof, wherein the plurality of anchor portions are arranged on the upper surface of the probe base plate so that a height of the anchor portion arranged at a center portion of the probe base plate may be greater than a height of the anchor portion located at a peripheral portion in a planar view.

Also, in the probe base plate according to the third embodiment, the plurality of probes can have equal heights to one another.

With the embodiments, a probe assembly and a probe base plate can be provided which uniform loads at the time of contact with a device under test and improve test accuracy.

DETAILED DESCRIPTION

Figure 1:
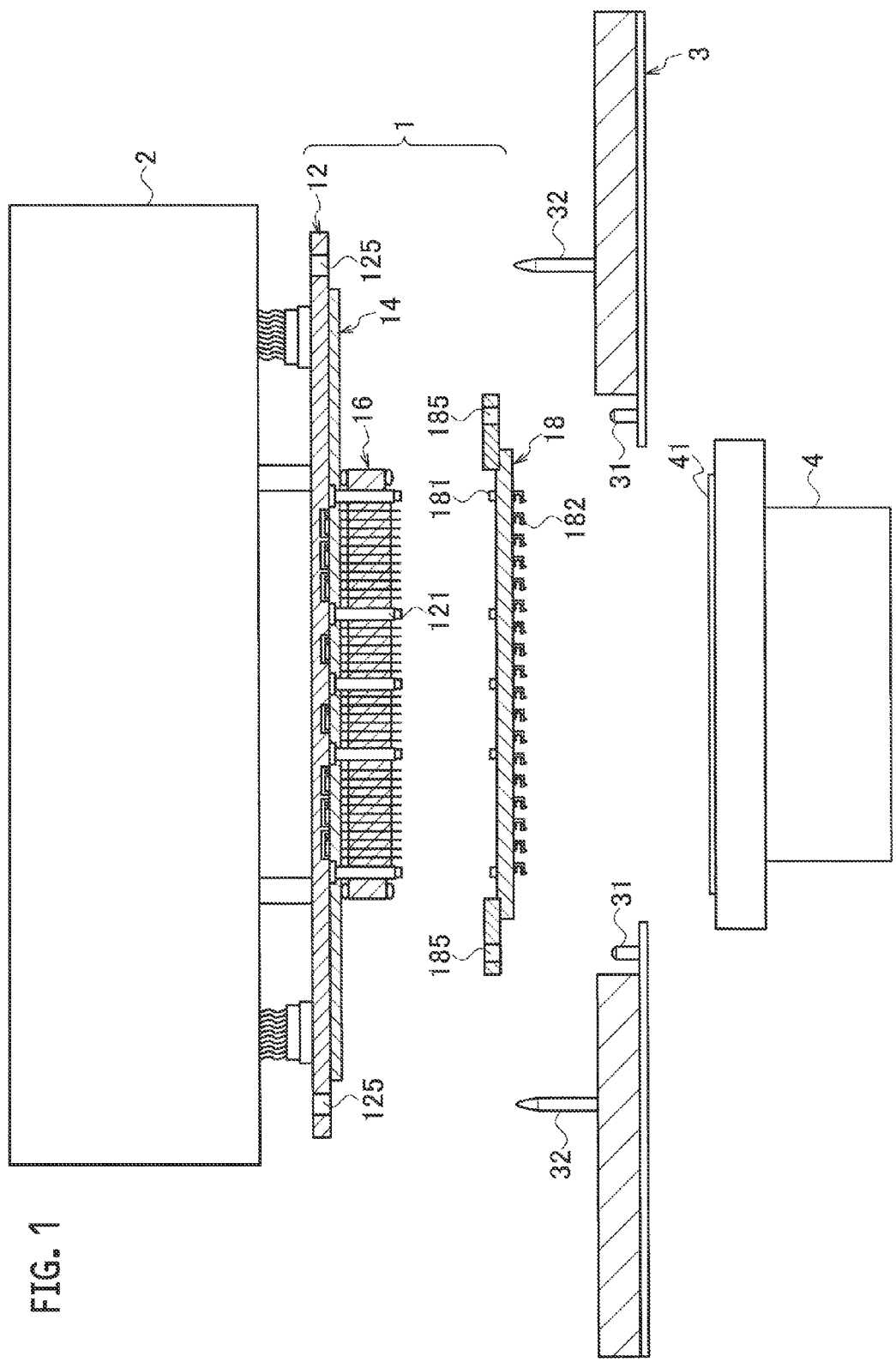
FIG. 1 illustrates a basic configuration of a semiconductor testing system including a probe assembly according to an embodiment, mainly illustrating a schematic cross-sectional view of the probe assembly.

Next, embodiments will be described with reference to the drawings. In the following description of the drawings, similar or identical parts are shown with similar or identical reference numerals. However, the drawings are schematic, and it is to be noted that relationship between dimensions in a cross-sectional view and dimensions in a plan view, ratios of thicknesses among respective layers, and the like differ from actual ones. Accordingly, specific thicknesses and dimensions shall be determined in consideration of the following description. Also, it is to be understood that some parts have different ratios of dimensions and different relationship among the drawings.

Also, the embodiments described below illustrate apparatuses and methods for embodying a technical idea of the subject matter, and in the technical idea of the subject matter, materials, shapes, structures, arrangements and the like of components are not limited to those described below. The technical idea of the subject matter can be altered in various ways within a technical scope described in the claims.

(Probe Assembly)

A semiconductor testing system including a probe assembly 1 according to an embodiment includes a test head 2 transmitting and receiving electric signals via the probe assembly 1 to and from a device under test (DUT) 41, a holder 3 holding and fixing the probe assembly 1, and a stage 4 fixing the DUT 41 on an upper surface thereof as illustrated in FIG. 1. The test head 2 is connected to a not illustrated tester main body and performs an electric test of the DUT 41 by control of the tester main body. The DUT 41 is a semiconductor wafer having formed thereon a plurality of integrated circuits, for example. The stage 4 is a so-to-speak XYZ stage enabling movement in three axial directions in a state of holding the DUT 41.

The probe assembly 1 includes a reinforcing plate 12, brace portions 121, a wiring base plate 14, an elastic connector 16, and a probe base plate 18 having formed on an upper surface thereof a plurality of anchor portions 181 and having formed on a lower surface thereof a plurality of probes 182. The holder 3 includes projecting portions 31 and 32. The projecting portions 31 and 32 are used as fixing portions fixing the probe base plate 18 with the reinforcing plate 12 together with hole portions 185 of the probe base plate 18 and hole portions 125 of the reinforcing plate 12, respectively.

Figure 2:
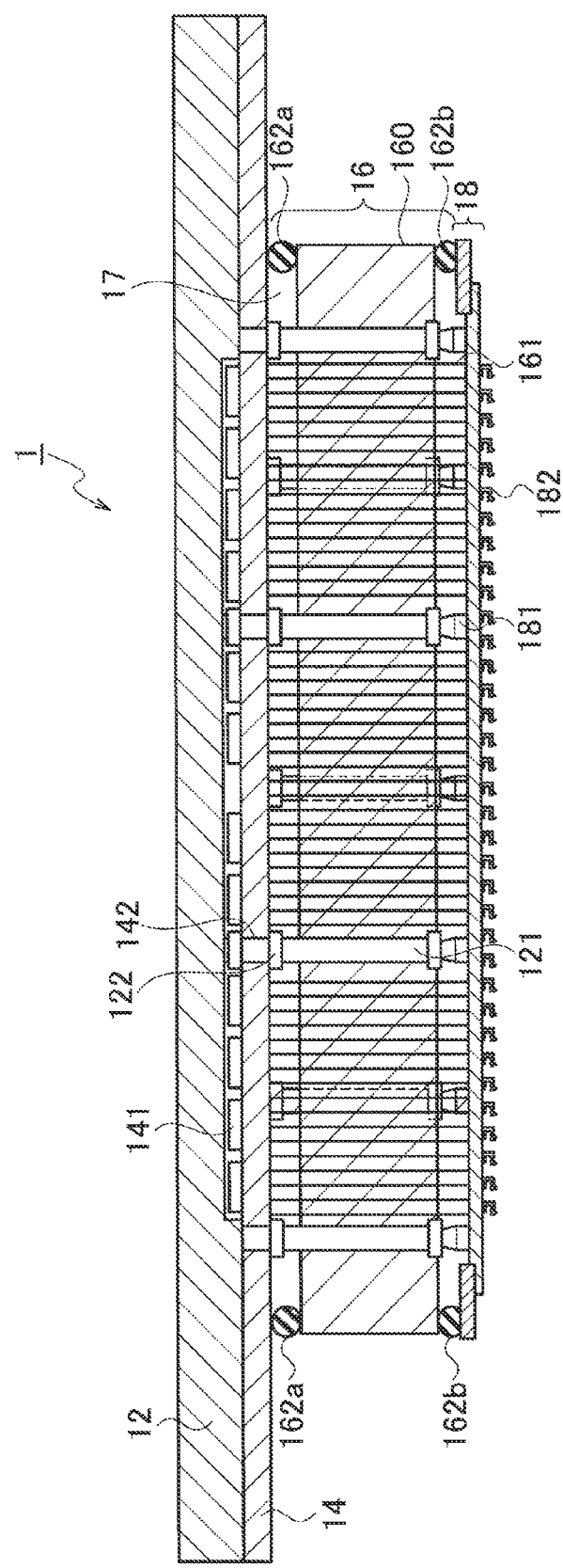
FIG. 2 is a schematic cross-sectional view illustrating the probe assembly according to the embodiment.

As illustrated in FIG. 2, the reinforcing plate 12 is schematically in a circular flat plate shape, for example, and reinforces the wiring base plate 14 and the probe base plate 18. The wiring base plate 14 is schematically in a circular flat plate shape, for example, and is arranged on a lower surface side of the reinforcing plate 12 to be parallel to the reinforcing plate 12. The wiring base plate 14 has circuits including switching elements 141 and the like required for a test of the DUT 41, and the circuits are connected to the test head 2. On a lower surface of the wiring base plate 14 are formed a plurality of not illustrated electrode pads as circuit terminals of the wiring base plate 14.

Figure 3:
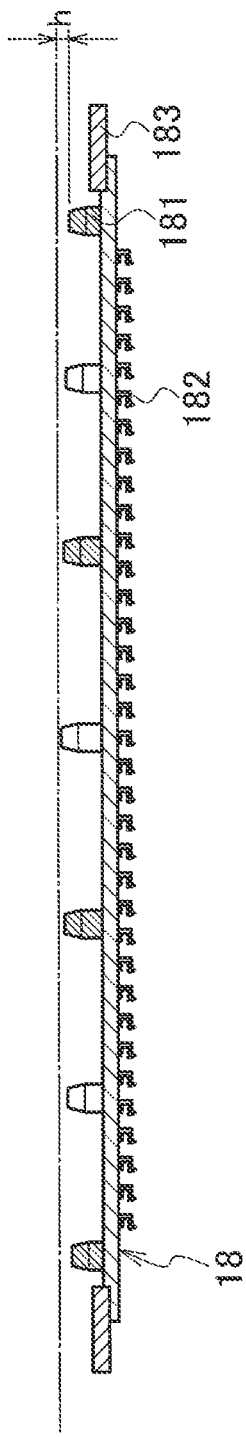
FIG. 3 is a schematic cross-sectional view illustrating a probe base plate provided in the probe assembly according to the embodiment.

The probe base plate 18 is schematically in a circular flat plate shape, for example, and is arranged on a lower surface side of the wiring base plate 14 to be parallel to the wiring base plate 14. The plurality of probes 182 have equal heights to one another. As illustrated in FIG. 3, the plurality of anchor portions 181 are formed so that a height of the anchor portion 181 located at a center portion of the probe base plate 18 may be greater than a height of the anchor portion 181 located at a peripheral portion in a planar view. For example, the anchor portion 181 at the center portion of the probe base plate 18 has a difference of a height h from that of the anchor portion 181 at the peripheral portion. The anchor portions 181 are formed so as to be gradually higher from the peripheral portion to the center portion.

Since a force for pressing up the respective probes 182 to be applied from the stage 4 via the DUT 41 is constant, the heights of the anchor portions 181 are determined in accordance with the number of the probes 182. The heights of the anchor portions 181 have only to be determined by a simulation based on loads from the stage 4, a shape, a dimension, and a material of the reinforcing plate 12, a dimension and a material of the wiring base plate 14, and the like, as well as the number of the probes 182.

The probe base plate 18 is provided on an upper surface thereof on which no anchor portions 181 are formed with a plurality of not illustrated electrode pads to be connected to the plurality of probes 182. The plurality of probes 182 contact respective terminals of the DUT 41 and transmit and receive electric signals by control of the test head 2.

The elastic connector 16 is in a circular flat plate shape, for example, and is arranged between the wiring base plate 14 and the probe base plate 18. The elastic connector 16 includes a plurality of pogo pins 161 that are connection portions electrically connecting the plurality of electrode pads of the wiring base plate 14 to the plurality of electrode pads of the probe base plate 18, a pogo block 160 holding the pogo pins 161, and sealing portions 162a and 162b. The pogo pins 161 are electrically connected to the probes 182 via the electrode pads of the probe base plate 18.

The plurality of brace portions 121 are arranged between the plurality of anchor portions 181 and the reinforcing plate 12 to correspond to the plurality of anchor portions 181, respectively. The brace portions 121 as well as the anchor portions 181 function as spacer portions (121, 181) determining a space between the probe base plate 18 and the wiring base plate 14. That is, the spacer portions (121, 181) are arranged between the probe base plate 18 and the reinforcing plate 12 so that a height of the spacer portion (121, 181) located at the center portion of the probe base plate 18 may be greater than a height of the spacer portion (121, 181) located at the peripheral portion in a planar view and determine a space between the probe base plate 18 and the wiring base plate 14.

Each brace portion 121 is fixed at one end thereof on a lower surface of the reinforcing plate 12 via a through hole 142 provided in the wiring base plate 14 and contacts at the other end thereof one end of the anchor portion 181. The brace portions 121 have equal heights to one another and are arranged to pass through the pogo block 160 of the elastic connector 16.

The brace portions 121 and the anchor portions 181 are fixed with each other by forming a decompression chamber 17 covering the pogo pins 161 between the wiring base plate 14 and the probe base plate 18. The decompression chamber 17 is formed by being sealed by the annular sealing portions 162a and 162b and sealing portions 122 sealing the through holes 142 and being decompressed by a not illustrated suction unit. The probe base plate 18 is fixed to the reinforcing plate 12 and the wiring base plate 14 by forming the decompression chamber 17.

Figure 4:
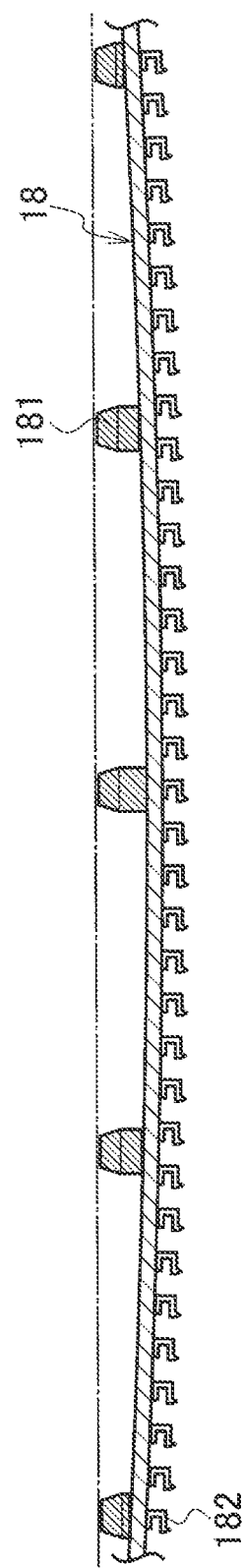
FIG. 4 is a schematic cross-sectional view illustrating a non-testing state of the probe base plate provided in the probe assembly according to the embodiment.

The probe base plate 18 fixed to the reinforcing plate 12 and the wiring base plate 14 is curved to be protruded downward in a state of not receiving a force pressing up the probes 182 from the stage 4 via the DUT 41 as illustrated in FIG. 4.

At the time of a test of the DUT 41, the stage 4 is driven, and the DUT 41 is aligned with the probes 182 of the probe assembly 1 fixed on the holder 3. The DUT 41 is pressed to the probes 182 of the probe assembly 1 by the stage 4 so that the respective terminals of the DUT 41 may contact the respective probes 182 reliably.

Figure 5:
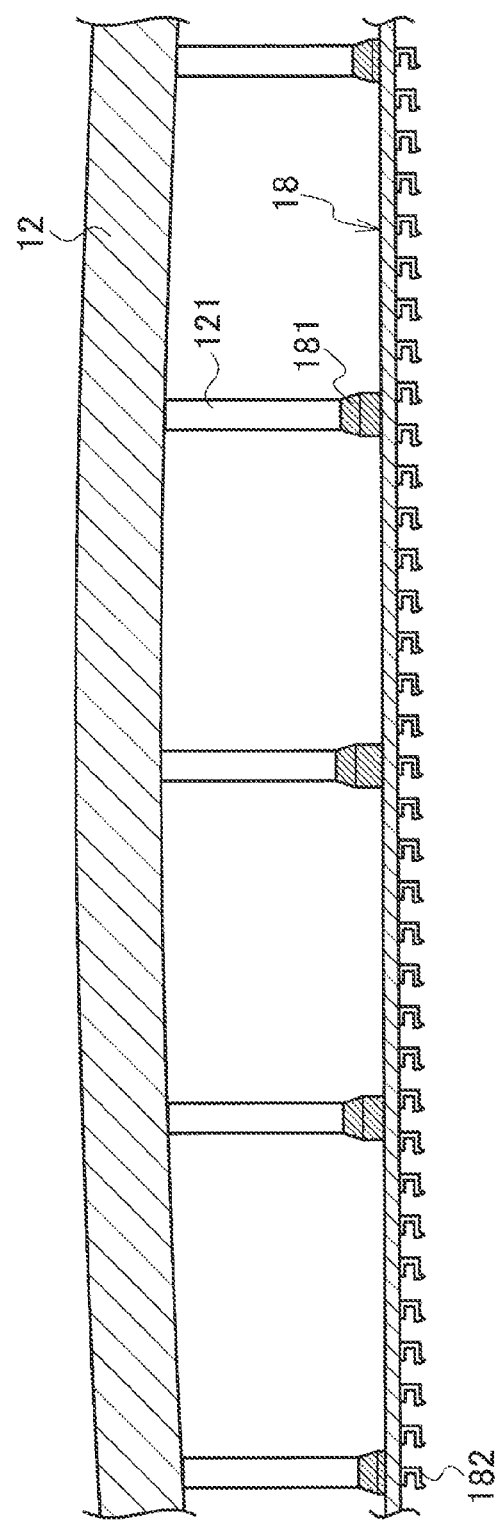
FIG. 5 is a schematic cross-sectional view illustrating a testing state of the probe base plate provided in the probe assembly according to the embodiment.

With the probe assembly 1 according to the present embodiment, by determining in advance heights of the anchor portions 181 in consideration of warping of the reinforcing plate 12 occurring by loads from the stage 4, the probe base plate 18 can be planar at the time of the test as illustrated in FIG. 5 (in FIG. 5, the wiring base plate 14 and the elastic connector 16 are omitted). Accordingly, with the probe assembly 1 according to the present embodiment, loads to the respective probes 182 can be uniformed at the time of the test, and test accuracy can be improved.

Also, with the probe assembly 1 according to the present embodiment, since the probes 182 of the probe base plate 18 are planarized at the time of the test by adjusting the heights of the anchor portions 181, a configuration is simpler, manufacturing cost is lower, and versatility is higher than in the case of adjusting heights of the probes 182. Also, even in a case where the density (number) of the probes 182 is changed due to a different device type of the DUT 41, the heights of the anchor portions 181 have only to be adjusted, the heights of the brace portions 121 do not need to be adjusted for each device type (probe density) of the DUT 41, and the device type change can be dealt with a simpler configuration than in the case of adjusting the heights of the brace portions 121. Further, with the probe assembly 1 according to the present embodiment, loads can be uniformed more accurately and more easily regardless of the device type (probe density) of the DUT 41 than in a method for clamping a center portion of a rear surface of a probe card.

Other Embodiments

Although the subject matter has been described above by the above embodiment, it should not be understood that the description and the drawings as parts of the present disclosure limit the subject matter. From the present disclosure, various alternative embodiments, examples, and operating techniques will become apparent to those skilled in the art.

In the foregoing embodiment, although a configuration in which the elastic connector 16 includes the pogo pins 161 has been described, the configuration is illustrative only, and various other configurations such as a connector using wires can be adopted.

Also, in the foregoing embodiment, although a configuration in which each spacer portion includes the brace portion 121 and the anchor portion 181 has been described, the configuration is illustrative only, and by each integral spacer portion, the probe base plate 18 may be curved to be protruded downward in a state where no force is applied to the probes 182. Also, the spacer portions (121, 181) may be arranged between the wiring base plate 14 and the probe base plate 18.

Also, in the foregoing embodiment, each spacer portion (121, 181) may include an adjusting mechanism enabling height adjustment. In an example of the adjusting mechanism, a screw groove may be provided in the anchor portion 181 to open an upper end of the anchor portion 181, and a screw may be inserted from an upper surface side of the reinforcing plate 12 to pass through the brace portion 121, to perform height adjustment by the inserted screw and the screw groove in the anchor portion 181.

It is to be understood that the subject matter includes various embodiments that are not described here. Accordingly, a technical scope of the subject matter is determined only by specified matters according to reasonable patent claims from the above description.

What is claimed is:

1. A probe assembly comprising:
   a reinforcing plate;
   a wiring base plate arranged on a lower surface side of the reinforcing plate;
   a probe base plate having an upper surface and a lower surface, arranged on a lower surface side of the wiring base plate, including a plurality of probes formed on the lower surface of the probe base plate and a plurality of anchor portions formed on the upper surface of the probe base plate, respectively, and arranging the plurality of anchor portions so that a height of the anchor portion arranged at a center portion of the probe base plate is greater than a height of the anchor portion located at a peripheral portion of the probe base plate in a planar view;
   an elastic connector arranged between the wiring base plate and the probe base plate and electrically connecting the wiring base plate to the plurality of probes; and
   a plurality of brace portions arranged between the plurality of anchor portions and the reinforcing plate to correspond to the plurality of anchor portions and determining a space between the probe base plate and the wiring base plate together with the plurality of anchor portions.

2. The probe assembly according to claim 1, wherein the probe base plate is curved to be protruded downward in a state where no force is applied to the plurality of probes.

3. The probe assembly according to claim 1, wherein the wiring base plate includes a plurality of through holes, and wherein the plurality of brace portions are arranged via the plurality of through holes.

4. The probe assembly according to claim 1, wherein the plurality of brace portions have equal heights to one another.

5. The probe assembly according to claim 1, wherein the elastic connector includes connection portions electrically connecting the wiring base plate to the plurality of probes, and wherein the probe base plate is fixed to the wiring base plate by forming a decompression chamber covering the connection portions between the wiring base plate and the probe base plate.

6. A probe assembly comprising:
a reinforcing plate;
a wiring base plate arranged on a lower surface side of the reinforcing plate;
a probe base plate arranged on a lower surface side of the wiring base plate and having formed on a lower surface thereof a plurality of probes;
an elastic connector arranged between the wiring base plate and the probe base plate and electrically connecting the wiring base plate to the plurality of probes; and
a plurality of spacer portions arranged between the probe base plate and the reinforcing plate and determining a space between the probe base plate and the wiring base plate, wherein a height of the spacer portion arranged at a center portion of the probe base plate is greater than a height of the spacer portion located at a peripheral portion of the probe base plate in a planar view.

7. The probe assembly according to claim 6, wherein the probe base plate is curved to be protruded downward in a state where no force is applied to the plurality of probes.

8. The probe assembly according to claim 6, wherein the plurality of spacer portions include a plurality of brace portions fixed at first ends thereof on the lower surface of the reinforcing plate and a plurality of anchor portions formed on an upper surface of the probe base plate and arranged to contact at first ends thereof second ends of the plurality of brace portions.

9. The probe assembly according to claim 8, wherein the wiring base plate includes a plurality of through holes, and wherein the plurality of brace portions are arranged via the plurality of through holes.

10. The probe assembly according to claim 6, wherein the plurality of brace portions have equal heights to one another.

11. The probe assembly according to claim 6, wherein the elastic connector includes connection portions electrically connecting the wiring base plate to the plurality of probes, and wherein the probe base plate is fixed to the wiring base plate by forming a decompression chamber covering the connection portions between the wiring base plate and the probe base plate.

* * * * *